United States Patent
Suzuki et al.

[11] Patent Number: 5,950,306
[45] Date of Patent: *Sep. 14, 1999

[54] CIRCUIT BOARD

[75] Inventors: Etsuji Suzuki, Yokohama; Akira Yonezawa, Tokyo; Hidehisa Yamazaki, Okayama-ken, all of Japan

[73] Assignee: Yamaichi Electronics Co., Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/763,953

[22] Filed: Dec. 11, 1996

[30] Foreign Application Priority Data

Dec. 12, 1995 [JP] Japan .................................. 7-346429

[51] Int. Cl.$^6$ .............................. H05K 3/36; H05K 3/42
[52] U.S. Cl. .................................. 29/852; 29/848; 29/830
[58] Field of Search ..................... 174/261, 262, 174/263, 264, 265, 266; 29/830, 839, 843, 848, 852, 853; 361/777, 779, 792, 793, 795; 428/209, 901; 439/82, 83, 84

[56] References Cited

U.S. PATENT DOCUMENTS

| | | | |
|---|---|---|---|
| 5,072,289 | 12/1991 | Sugimoto et al. | 357/68 |
| 5,309,629 | 5/1994 | Traskos et al. | 174/262 X |
| 5,464,682 | 11/1995 | Perfecto et al. | 174/261 X |

FOREIGN PATENT DOCUMENTS

| | | |
|---|---|---|
| 5-90739 | 4/1993 | Japan . |
| 7-193372 | 7/1995 | Japan . |

*Primary Examiner*—Lee W. Young
*Assistant Examiner*—Bobby Rushing, Jr.
*Attorney, Agent, or Firm*—Wenderoth, Lind & Ponack, L.L.P.

[57] ABSTRACT

A circuit board includes a wiring board which includes an insulative board having a wiring pattern on one surface thereof, a connection hole being formed in the insulative board such that the connection hole reaches the wiring pattern, a conductive bump, which is formed by growing a plating on the wiring pattern, being embedded in the connection hole, and the conductive bump serves as a connection to a wiring pattern which is intimately attached to the other surface of the insulative board.

3 Claims, 5 Drawing Sheets

CIRCUIT BOARD

BACKGROUND OF THE INVENTION

1. Field of the Invention

This invention relates to a circuit board which is advantageous for forming a multiple-layered wiring pattern.

2. Brief Description of the Prior Art

With electronic devices being progressively made much smaller and thinner, there are increasingly strong demands for a circuit board which is designed to have a much smaller and lighter construction so that the circuit board will be suited to be used for those electronic devices which are being made much smaller and thinner.

One such representative example is a circuit board called a "multi-chip module (MCM)". In the MCM, a plurality of bare ICs are mounted on a multiple-layered circuit board and then mounted, as a single component part, on a circuit board acting as a mother board.

It is particularly strongly demanded of such a MCM circuit board that wiring is designed very small and arranged at a high density. At the same time, it is strongly demanded that the multiple-layered circuit board be designed thinner and manufactured at a lower cost.

One of the hindrances, which makes it difficult to meet such a demand, resides in the conventional techniques in which layers of the wiring patterns are inter-connected by means of a through-hole connection method. In this through-hole connection method, an insulative board is provided with very tiny connection holes which are formed all the way through the wiring patterns by drilling, laser or the like, and an inner wall surface of each connection hole is plated with a conductive layer (namely, the inner wall surface of each connection hole is subjected to a so-called through-hole plating). This conventional method has such shortcomings that when holes are bored in the insulative board by drilling or other means, burrs and metal powder tend to be produced, thus tending to degrade the quality and reliability of the through-hole plating.

Particularly, with the wiring patterns being made much smaller in design, it became increasingly technically difficult to make an accurate drilling or the like with respect to the insulative board without accidentally cutting off the wiring patterns.

Furthermore, the conventional techniques often encounter such problems that the areas for mounting the electronic parts and the areas for wiring are obliged to be limited because of a provision of the through-holes and due to installation of the wiring.

In order to cope with such shortcomings and problems, one approach is made in which the through-holes formed in the wiring patterns are filled with resin, and then the wiring and electrodes for mounting parts are applied to the top thereof. These through-holes are called "blind barrier holes" or "inner via hole", and are already utilized in actual practice.

However, they have problems not only in the area of techniques but also of cost. Accordingly, it is demanded to realize that wiring can be made at a very small pitch, and a circuit board, which is substantially of the blind barrier hole type or the inner via hole type, can be manufactured at a low cost.

SUMMARY OF THE INVENTION

It is, therefore, an object of the present invention, to provide a circuit board in which multiple-layered patterns can be inter-connected reliably.

Another object of the invention is to provide a circuit board in which multiple-layered patterns can be arranged at a high density.

A further object of the invention is to provide a circuit board which can be manufactured at a low cost.

To achieve the above objects, there is essentially provided a circuit board comprising a wiring board which comprises an insulative board having a wiring pattern on one surface thereof, a connection hole being formed in the insulative board such that the connection hole reaches the wiring pattern, a conductive bump, which is formed by growing a plating on the wiring pattern, being embedded in the connection hole, and the conductive bump being served as connection means with respect to a wiring pattern which is intimately attached to the other surface of the insulative board.

Preferably the conductive bump is embedded in the insulative board such that the conductive bump does not reach the other surface of the insulative board, and thus leaves a vacant space in the connection hole, not occupied by the conductive bump, the vacant space serves as a hole for filling therein conductive paste for connecting the wiring pattern formed on the other surface of the insulative board and the conductive bump together.

It may also be designed such that the conductive bump is embedded in the connection hole such that the conductive bump does not reach the other surface of the insulative board, and conductive paste is filled in the vacant space in the connection hole, which vacant space is not occupied by the conductive bump, thereby forming a fusible contact point, the contact point serving as connection means with respect to the wiring pattern formed on the other surface of the insulative board.

The above and other objects, characteristic features and advantages of the present invention will become more apparent to those skilled in the art by the following description of the preferred embodiments of the invention, as illustrated in the accompanying drawings.

DETAILED DESCRIPTION OF THE EMBODIMENTS

A construction of a circuit board according to one preferred embodiment of the present invention, and the sequential steps of manufacturing the same will now be described with reference to the accompanying drawings.

Figure 1A:
FIGS. 1A through 1F are sectional views showing the sequential steps of manufacturing a multiple-layered circuit board according to one embodiment of the present invention.

First, as shown in FIG. 1A, a plate having copper attached to one surface thereof (this plate is hereinafter referred to as the "single-surface copper-attached plate") is formed by intimately attaching a copper foil 2 to an entire surface of an insulative board 1.

The surface of the insulative board 1 is melted by hot pressing or the like and the copper foil 2 is fused thereto without a need of a provision of any adhesive layer between the insulative board 1 and the copper foil 2. The insulative board 1 and the copper foil 2 may be attached together by hot pressing or the like, with an adhesive layer interposed between the insulative board 1 and the copper foil 2. However, anticipating a difficulty which will be encountered in the step to follow, it is advantageous that no adhesive layer is provided.

The insulative board 1 employed here refers to a synthetic resin plate having rigidity or a synthetic resin sheet having flexibility. The material of the insulative board 1 includes, for example, thermoplastic liquid crystal polymer resin, and polyimide resin such as, for example, reinforced-fiber contained polyimide resin. Also, the insulative board 1 may be single formed in a or multiple layers.

Figure 1B:

Next, as shown in FIG. 1B, a plurality of connection holes 3 are formed only in the insulative board 1 which is formed of the single-surface copper-attached plate, by laser, etching or the like, such that the holes 3 extend all the way to the copper foil 2, thereby forming a drilled single-surface copper-attached plate.

The connection holes 3 are through-holes piercing through only the insulative board 1 in its thickness direction. Accordingly, one end of each connection hole 3 reaches one surface of the insulative board 1, while the other end reaches the other surface of the insulative board 1. That end of each connection hole 3 which reaches the attachment surface of the copper foil 2, is closed by the copper foil 2. The steps of FIGS. 1A and 1B may be changed such that the connection holes 3 are preliminarily drilled in the insulative board 1 and then the copper foil 2 is attached to the second-mentioned surface of the insulative board 1, thereby forming a drilled single-surface copper-attached plate.

Figure 1C:
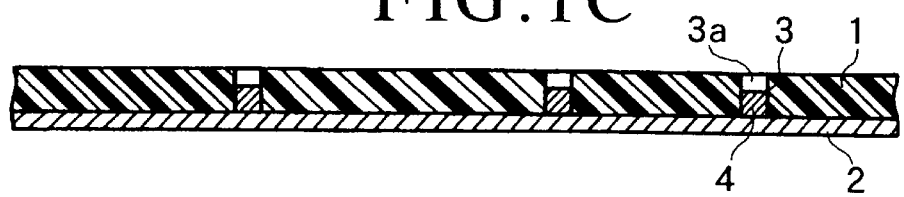

Then, as shown in FIG. 1C, conductive bumps 4 for filling the connection holes 3 of the drilled single-surface copper-attached plate are formed on the copper foil 2 which closes the connection holes 3. The conductive bumps 4 are formed by enhancing the growth of plating within the connection holes 3 by way of electric plating, serving the copper foil 2 as an electrode.

As one example, each of the conductive bumps 4 is grown to a level of height which does not reach the other surface of the insulative board 1. In other words, each conductive bump 4 is grown to a level of height less than the full depth of each connection hole 3, so that there is a vacant space in the connection hole on the side of the other surface of the insulative board 1, which vacant space is occupied by no conductive bump 4. This vacant space in each connection hole 3 serves as a hole 3a into which conductive paste is filled in the following step.

Figure 1D:

Then, as shown in FIG. 1D, conductive paste 5 is applied and filled in the filling holes 3a from the other surface side of the single-surface copper-attached plate, which is provided with the connection holes 3 having the conductive bumps 4 embedded therein, by means of screen printing or the like, such that a predetermined quantity of the conductive paste 5 slightly projects from the surface of the insulative board 1. Thereafter, the conductive paste 5 is dried and hardened, thereby forming fusible contact point portions.

That is, each of the fusible contact point portions comprises conductive paste. Each contact point portion includes an embedded-portion which is embedded in the filling hole 3a and a projection portion projecting therefrom. The contact point portion is connected at its embedded portion to the conductive bump 4, thereby forming a bump as a whole. The conductive paste 5 is a soldering paste which is composed, for example, of kneading silver powders and synthetic resin adhesive or kneading metal powders of a lead series and synthetic resin.

Figure 1E:
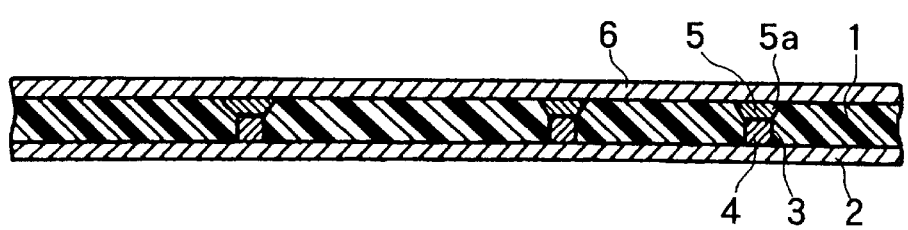

Thereafter, as shown in FIG. 1E, another copper foil 6 is applied and attached, by hot pressing, intimately to the other surface of the single-surface copper-attached plate (the other surface of the insulative board 1) on which the fusible contact point portions are formed by the conductive paste 5.

That is, the copper foil 6 is placed on the projected portions of the fusible contact point portions which are composed of the conductive paste 5, in such a way as to cover the entire surface of the insulative board 1. Then the fusible contact point portions are softened or melted by hot pressing and at the same time, the surface of the insulative board 1 is melted, and thereafter, the copper foil 6 is intimately attached to the surface of the insulative board 1 and fused to the fusible contact point portions. Thus, the copper foil 6 is connected to the conductive bumps 4 through the fusible contact point portions and further connected to the other copper foil 2 through the conductive bumps 4.

The conductive paste 5, namely, the fusible contact point portions are softened or melted by heat of the hot pressing and at the same time, they are, while being compressed and stretched under pressure, pushed into the surface layer portion of the melted insulative board 1, thereby composing enlarged press-attachment portions 5a each having a wide connection area.

In this way, there can be obtained a double-surface copper-attached plate in which the copper foils 2, 6 on the two surfaces are firmly joined and connected together at those places where the wiring patterns are desired to be connected together, by fusing or press-attaching through the conductive bumps 4 and the conductive paste 5.

Figure 1F:
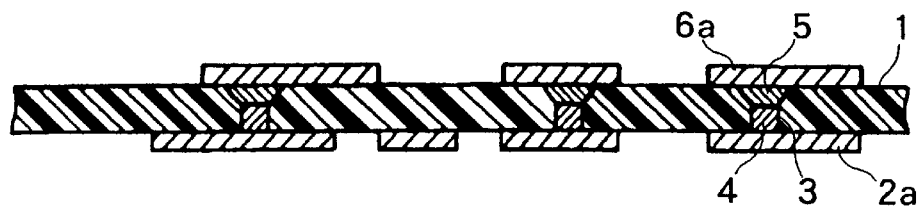

Then, as shown in FIG. 1F, the copper foils 2, 6 on the two surfaces are subjected to patterning by known techniques such as exposure, etching or the like. As a consequence, there can be obtained a double-surface circuit board in which the wiring patterns 2a, 6a are intimately attached to the two surfaces of the insulative board 1 and are connected together by the conductive bumps 4, which are formed by growing the plating within the connection holes 3, through the conductive paste 5. The double surface circuit board thus obtained can be used as a unit circuit board for forming a circuit board having three or more layers.

As apparent from the above explanation, the conductive bumps 4 are positively grown, under the limitation of the connection holes 3, into and positively embedded in the connection holes from the surface of the copper foil 2 which closes the connection holes 3. Accordingly, the good or bad conditions of the walls of the connection holes 3 cannot be a big problem.

Especially, since plating can fill such a very tiny hole having a dimension of a few dozen $\mu$m, the connection areas of the copper foil 2 for growing the conductive bumps 4 by plating growth can be designed very small.

In other words, the connection area of each wiring pattern 2a which is formed from the copper foil 2 can be designed very small. As a consequence, the wiring patterns 2a, 6a can be made very small without being limited by the connection hole 3. This makes it possible to realize a high density arrangement of the patterns.

That is, FIGS. 1A–1F illustrate an idea which includes forming the connection holes 3 in the insulative board such that the connection holes 3 extend to the wiring patterns 2a, in the wiring board 1 having the wiring pattern 2 which is intimately attached to one surface of the insulative board 1, then the conductive bumps 4 grown into the connection holes 3 from the wiring patterns 2a by means of plating growth, and the conductive bumps 4 are provided as connection means with respect to the wiring patterns 6a which are intimately attached to the other surface of the insulative board 1.

Another example for forming the circuit board will now be described.

Figure 2A:
FIGS. 2A through 2F are sectional views showing the sequential steps of manufacturing a multiple-layered circuit board according to another embodiment of the present invention.

First, as shown in FIG. 2A, a plate having copper attached to one surface thereof (this plate is hereinafter referred to as the "single-surface copper-attached plate") is formed by intimately attaching a copper foil 2 to an entire surface of an insulative board 1.

The insulative board 1 employed here refers to a synthetic resin plate having rigidity or a synthetic resin sheet having flexibility. The material of the insulative board 1 includes, for example, reinforced-fiber contained polyimide resin such as glass fiber or glass cloth. Also, the insulative board may be formed of a single layer or multiple layers made of the same or different materials.

Figure 2B:
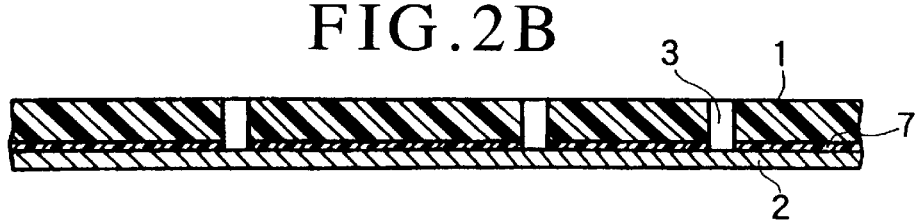

Next, as shown in FIG. 2B, a plurality of connection holes 3 are formed only in the insulative board 1 which is formed of the single-surface copper-attached plate, by laser, etching or the like, such that the holes 3 extend all the way through an adhesive layer 7 to the copper foil 2, thereby forming a drilled single-surface copper-attached plate.

The steps of FIGS. 1A and 1B may be changed such that the connection holes 3 are preliminarily drilled in the insulative board 1 and then the copper foil 2 is attached to the second-mentioned surface of the insulative board 1, thereby forming a drilled single-surface copper-attached plate.

The connection holes 3 are through-holes piercing through only the insulative board 1 in its thickness direction. Accordingly, one end of each connection hole 3 extends through the adhesive layer 7 and reaches one surface side of the insulative board 1, while the other end reaches the other surface of the insulative board 1. That end of each connection hole 3, which reaches the attachment surface of the copper foil 2, is closed by the copper foil 2.

Figure 2C:

Then, as shown in FIG. 2C, conductive bumps 4 for filling the connection holes 3 of the drilled single-surface copper-attached plate are formed on the copper foil 2 which closes the connection holes 3. The conductive bumps 4 are formed by enhancing the growth of plating within the connection holes 3 by way of electric plating, serving the copper foil 2 as an electrode.

As one example, each of the conductive bumps 4 is grown to a level of height which does not reach the other surface of the insulative board 1. In other words, each conductive bump 4 is grown to a level of height less than the fill depth of each connection hole 3, so that there is a vacant space in the connection hole on the side of the other surface of the insulative board 1, which vacant space is occupied by no conductive bump 4. This vacant space in each connection hole 3 serves as a hole 3a into which conductive paste is filled in the following step.

Figure 2D:
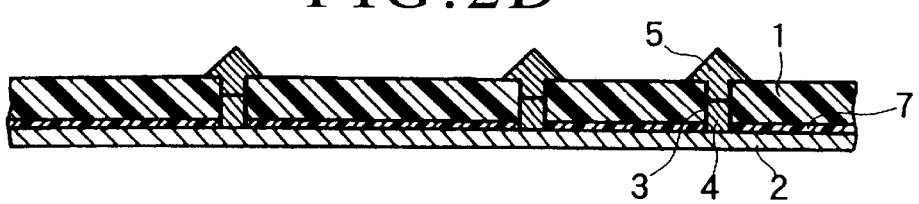

Then, as shown in FIG. 2D, conductive paste 5 is applied and filled in the filling holes 3a from the other surface side of the single-surface copper-attached plate, which is provided with the connection holes 3 having the conductive bumps 4 embedded therein, by means of screen printing or the like, such that a predetermined quantity of the conductive paste 5 slightly projects from the surface of the insulative board 1. Thereafter, the conductive paste 5 is dried and hardened, thereby forming fusible contact point portions.

That is, each of the fusible contact point portions comprises conductive paste. Each contact point portion includes an embedded-portion which is embedded in the filling hole 3a and a projection portion projecting therefrom. The contact point portion is connected at its embedded portion to the conductive bump 4, thereby forming a bump as a whole.

The projection portions are sharp, as illustrated, at their distal ends so that they can pierce an adhesive layer 8. The distal end of the conductive paste 5 may be flat or sharp at its distal end. The same is true for the embodiment of FIGS. 1A–1F. The conductive paste 5 is one which is composed, for example, of kneading silver powders and synthetic resin adhesive.

Figure 2E:
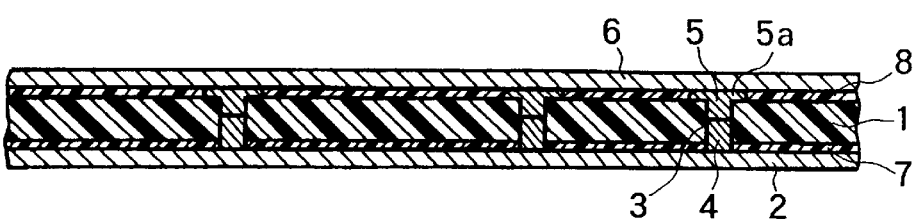

Thereafter, as shown in FIG. 2E, another copper foil 6 is applied through the adhesive layer 8 and attached, by hot pressing, intimately to the other surface of the single-surface copper-attached plate (the other surface of the insulative board) on which the fusible contact point portions are formed by the conductive paste 5.

That is, the copper foil 6 is placed on the projection portions of the fusible contact point portions which are composed of the conductive paste 5, in such a way to cover the entire surface of the insulative board 1, and then the fusible contact point portions are softened or melted all the way through the adhesive layer 8 by hot pressing, so as to be intimately attached (fused) to the copper foil 6. Thus, the copper foil 6 is connected to the conductive bumps 4 through the fusible contact point portions and further connected to the copper foil 2 through the conductive bumps 4.

The conductive paste 5, namely, the fusible contact point portions are softened or melted by heat of the hot pressing and at the same time, they are, while being compressed and stretched under pressure in their state piercing the adhesive layer 8 under pressure, pushed into the surface layer portion of the adhesive layer 8, thereby composing enlarged press-attachment portions 5a each having a wide connection area.

In this way, there can be obtained a double-surface copper-attached plate in which the copper foils 2, 6 on the two surfaces are firmly joined and connected together at those places where the wiring patterns are desired to be connected together, by metal welding through the conductive bumps 4 and the conductive paste 5.

Figure 2F:
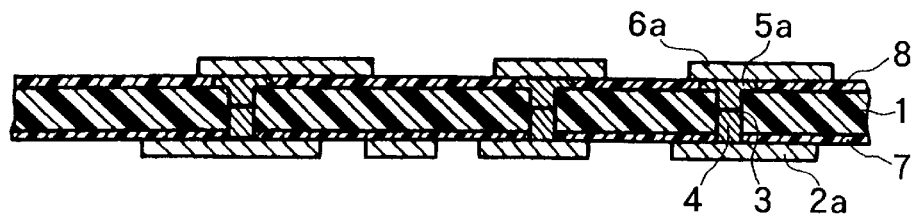

Then, as shown in FIG. 2F, the copper foils 2, 6 on the two surfaces are subjected to patterning by known techniques such as exposure, etching or the like. As a consequence, there can be obtained a double surface circuit board in which the wiring patterns 2a, 6a are intimately attached to the two surfaces of the insulative board 1 and are connected together by the conductive bumps 4, which are formed by growing the plating within the connection holes 3, through the conductive paste 5. The double surface circuit board thus obtained can be used as a unit circuit board for forming a circuit board having three or more layers.

As apparent from the above explanation, the conductive bumps 4 are positively grown, under the limitation of the connection holes 3, into and positively embedded in the connection holes from the surface of the copper foil 2 which closes the connection holes 3. Accordingly, good or bad conditions of the walls of the connection holes 3 cannot be a big problem.

Especially, since plating can fill such a very tiny hole having a dimension of a few dozen $\mu$m, the connection areas of the copper foil 2 for growing the conductive bumps 4 by plating growth can be designed very small.

In other words, the connection area of each wiring pattern 2a which is formed from the copper foil 2 can be designed very small. As a consequence, the wiring patterns 2a, 6a can be made very small without being limited by the connection hole 3. This makes it possible to realize a high density arrangement of the patterns.

Irregularity of the height of the conductive bumps 4 can favorably be absorbed by interposing the fusible contact point portions composed of the conductive paste 5 between the grown conductive bumps 4 and the copper foil 6 (wiring pattern 6a).

Figure 3A:
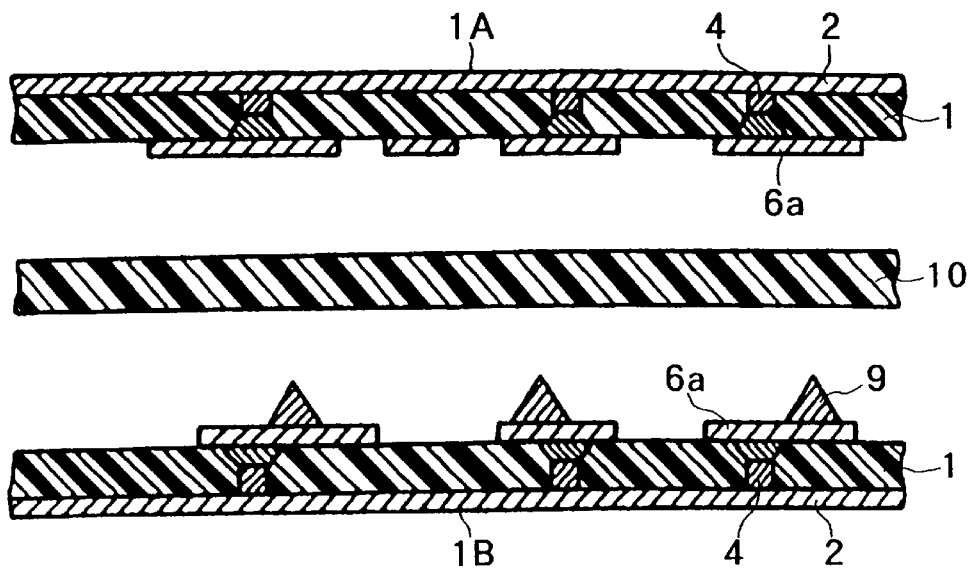
FIGS. 3A through 3C are sectional views showing the sequential steps of manufacturing a quadruplicate-layered circuit board having the same component elements of those of the circuit board of FIGS. 1 and 2, according to a still further embodiment of the present invention.
Figure 3B:
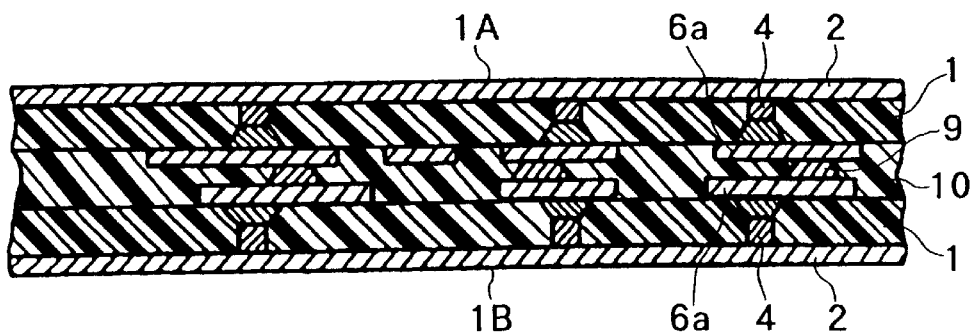
Figure 3C:
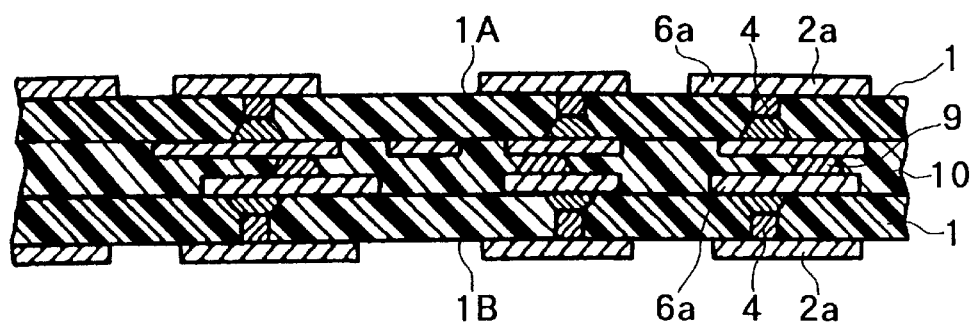

FIG. 3 shows a construction of a four-layer circuit board which is manufactured utilizing the techniques of forming the circuit board as disclosed in FIGS. 1A–1F and 2A–2F, and a method of manufacturing such a construction.

Only one surface (only the copper foil 6) of the double-surface copper-attached plate manufactured by FIGS. 1A through 1E and FIGS. 2A through 2E is subjected to patterning by etching, and as a result, a pair of circuit boards 1A and 1B are obtained as shown in FIGS. 1A and 1B.

That is, a pair of circuit boards 1A and 1B, which include, as one set, an insulative board 1, a copper foil 2, a wiring pattern 6a, and a conductive bump 4 grown from the copper foil within a connection hole 3, are manufactured. Then, conductive paste 9 is applied to a predetermined place on the outer surface of the wiring pattern 6a of the circuit board 1A or 1B by printing or by a dispenser, and hardened to form the conductive bump. The conductive paste in the form of the conductive bump is appropriately sharpened at its distal end.

As shown in FIG. 3A, the circuit boards 1A and 1B are disposed to face each other at those surfaces on which the wiring pattern 6a and the conductive paste 9 are formed. A heat fusible adhesive sheet 10 is interposed between the circuit boards 1A and 1B. Then, those three component members, namely, the circuit boards 1A and 1B and the adhesive sheet 10, are thermo-bonded together at a temperature equal to or higher than the thermo-softening temperature of the adhesive sheet 10.

As shown in FIG. 3B, by this thermo-bonding, the bump consisting of the conductive paste 9 is allowed to pierce through the adhesive sheet 10 and become pressure-bonded to the wiring pattern 6a of the circuit board 1A while being thermally deformed. As a consequence, the mutually corresponding patterns 6a are connected together through the bump which consists of the conductive paste 9. As a consequence, the circuit boards 1A and 1B are intimately attached together by thermally fusing the adhesive sheet 10.

Then, both the circuit boards 1A and 1B are subjected to patterning by exposing/etching the copper foils 2 thereof. As a consequence, the wiring patterns 2a are formed on the circuit boards 1A and 1B, respectively. In this way, there can be obtained a four-layers circuit board having the four-layers of the wiring patterns 2a, 6a, 6a 2a which are connected together.

The material of the thermo-fusible adhesive sheet 10 is appropriately selected from those which can be thermo-bonded at a temperature which is as much lower than the softening temperature (Tg temperature) of the insulative board 1 as possible.

Figure 4:
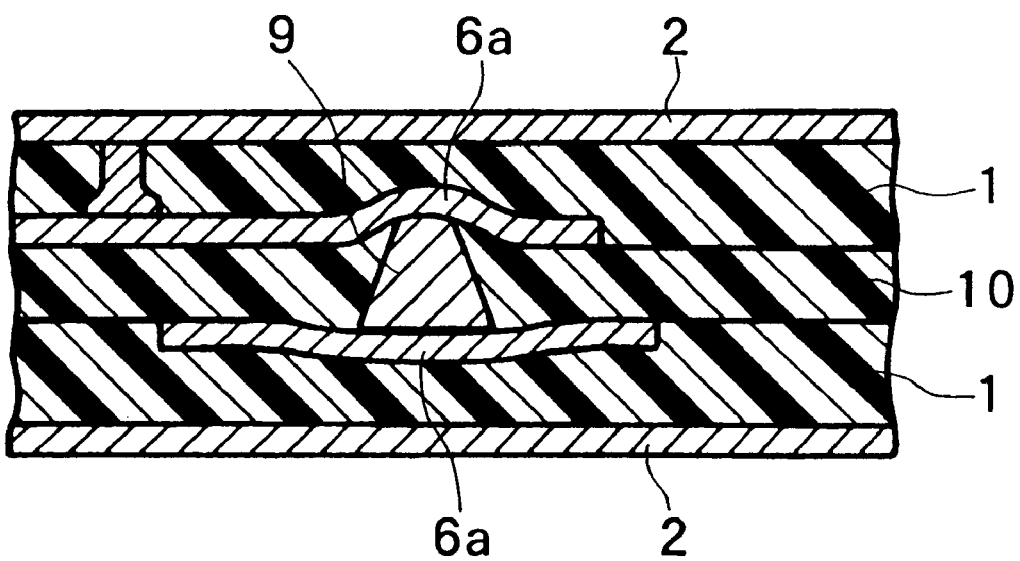
FIG. 4 is an enlarged sectional view showing an example of a bad circuit board manufactured according to the sequential steps of FIG. 3.

That is, when the adhesive sheet 10 is thermo-bonded at a temperature near the Tg temperature, the softening of the insulative boards 1 causes the bump consisting of the conductive paste 9 to locally compress and deform the wiring patterns 6a. When the wiring patterns 6a are overly deformed, the wiring patterns 6a form a short circuit with respect to the copper foils 2. This results in an inferior product as shown in FIG. 4.

Figure 5A:
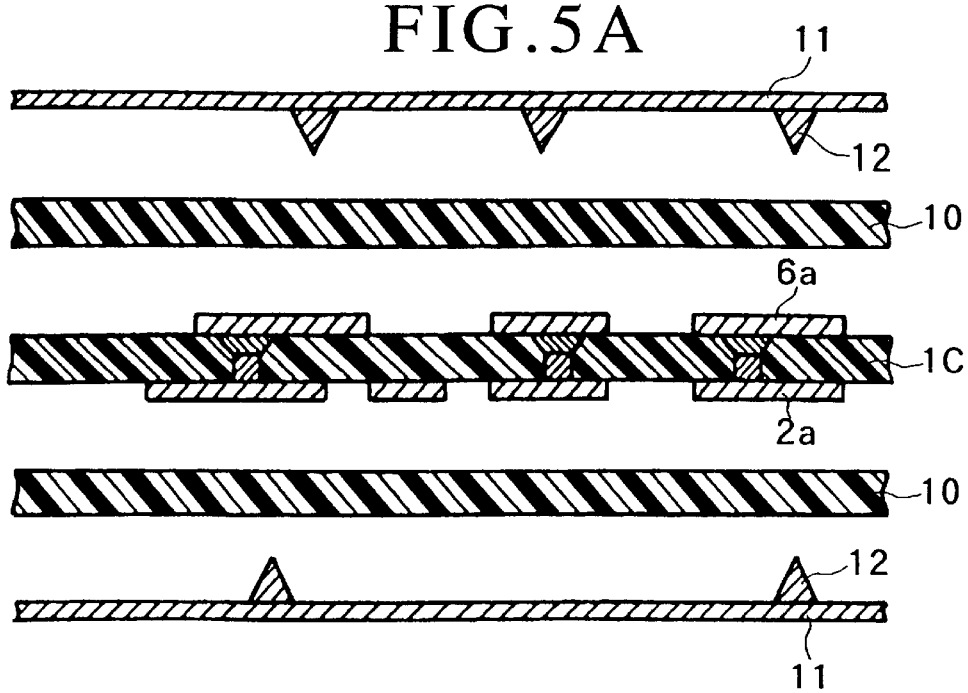
FIGS. 5A through 5C are sectional views showing the sequential steps of manufacturing a quadruplicate-layered circuit board having the same component elements of those of the circuit board of FIGS. 1 and 2, according to a yet further embodiment of the present invention.
Figure 5B:
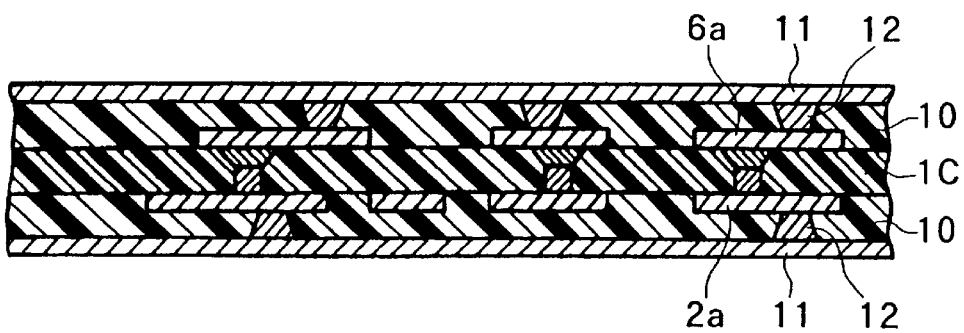
Figure 5C:
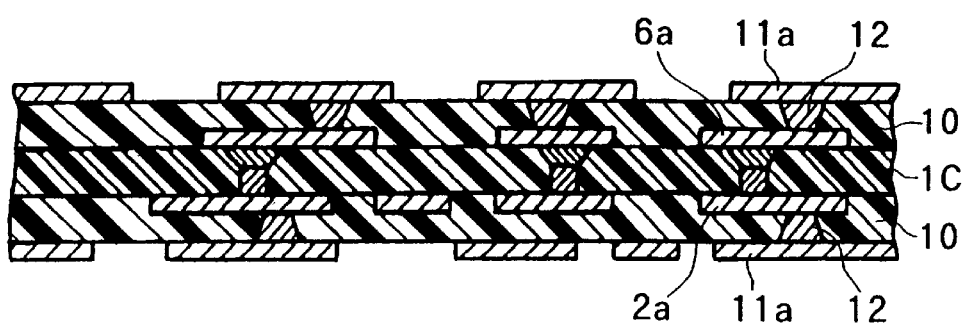

Next, FIG. 5 shows still another example of a method of manufacturing the four-layer circuit board and a construction thereof. As shown in FIG. 5A, a double surface circuit board 1C provided on both surfaces thereof with patterns 2a and 6a which are manufactured in accordance with the teachings of FIGS. 1A–1F and 2A–2F, is prepared. On the other hand, two copper foils provided with bumps having sharpened distal ends are formed by applying conductive paste 12 to the copper foils 11. Then, the double surface circuit board 1C is interposed between the bump-attached copper foils 11. Then, an adhesive sheet 10 composed of a thermo-fusible synthetic resin sheet is interposed between one side of the double surface circuit board 1C and the bump-attached copper foil 11, and another such adhesive sheet 10 is likewise interposed between the other side of the double surface circuit board 1C and the other bump-attached copper foil 11. Thereafter, those five component members 11, 10, 1C, 10 and 11 are superimposed in this order, and they are thermo-bonded at a temperature which is equal to or higher than the thermo-softening temperature of the adhesive sheet 10 but which is equal to or lower than the softening temperature of the double surface circuit board 1C.

This thermo-bonding causes the bumps composed of the conductive pastes 12 to pierce through the adhesive sheets 10 so as to be pressure attached to the wiring patterns 2a and 6a, respectively, while being softened. At the same time, the bump-attached copper foils 11 are fused to the two surfaces of the double surface circuit board 1C, respectively, through the adhesive sheets 10.

Subsequently, the copper foils 11 are subjected to patterning by applying an etching process or the like thereto. As a consequence, a wiring pattern 11a is formed on each surface of the double surface circuit board 1C.

Although FIGS. 4 and 5 illustrate the four-layer circuit boards, there can be obtained a multiple-layered circuit board having five or more layers by arranging additional bump-attached copper foils 11 and additional adhesive sheets 10 on one and the other sides of the four-layer circuit board and performing the same steps as previously mentioned.

According to the present invention, the conductive bumps can be positively grown, under the limitation of the connection holes, into and positively embedded in the connection holes from the surface of the copper foil which closes the connection holes. Accordingly, reliable conductive bumps can be formed irrespective of the good or bad conditions of the walls of the connection holes.

Especially, since plating can fill such a very tiny hole as having a dimension of a few dozen $\mu$m, the connection areas of the copper foils for growing the conductive bumps by plating growth, namely, the connection areas between the wiring patterns which are formed from the copper foil, can be designed very small. As a consequence, the wiring-patterns can be made very small without being limited by the connection hole. This makes it possible to realize a high density arrangement of the patterns.

Thus, the problems inherent in the prior art in which the wiring patterns are drilled and connected together by means of through-hole plating, can effectively be obviated.

Furthermore, irregularity of the height of the conductive bumps can favorably be absorbed by interposing the fusible contact point portions composed of the conductive paste between the grown conductive bumps and the copper foil (wiring pattern). Moreover, irregularity of the thickness of the plating can also be absorbed when the conductive bumps are thermo-fusible solder plating or the like.

While there has been described what is at present considered to be the preferred embodiments of the invention, it will be understood that various modifications may be made thereto, and it is intended that the appended claims cover such modifications which fall within the true spirit and scope of the invention.

What is claimed is:

1. A method of constructing a circuit board, said method comprising:

providing a wiring board comprising an insulative board having first and second surfaces, and a first wiring pattern member attached to said first surface of said insulative board, a connection hole being formed in said insulative board and extending from an inner surface of said first wiring pattern member through said second surface of said insulative board;

plate-growing a conductive bump on said inner surface of said first wiring pattern member and in said connection hole such that said conductive bump extends from said inner surface of said first wiring pattern member to a level short of said second surface of said insulative board so as to not occupy a portion of said connection hole adjacent to said second surface of said insulative board;

filling conductive paste into said portion of said connection hole not occupied by said conductive bump so that the conductive paste fills said portion of said connection hole not occupied by said conductive bump and projects above said second surface of said insulative board to form a fusible contact point portion; and applying a second wiring pattern member to said second surface of said insulative board, and applying heat so as to melt the fusible contact point portion of said conductive paste and thereby fuse said second wiring pattern member to said conductive paste;

wherein said conductive paste is filled into said connection hole and said heat is applied in such a manner that, when melted, the fusible contact point portion pushes into a surface layer portion of said second surface of said insulative board and forms an enlarged press-attachment portion of said conductive paste.

2. A method as recited in claim 1, said method further comprising:

providing an adhesive layer between said insulative board and said first wiring pattern member.

3. A method of constructing a circuit board, said method comprising:

providing a wiring board comprising an insulative board having first and second surfaces, a first adhesive layer attached to said first surface of said insulative board, a first wiring pattern member attached to said first adhesive layer, and a connection hole being formed in said insulative board and said first adhesive layer and extending from an inner surface of said first wiring pattern member through said second surface of said insulative board;

plate-growing a conductive bump on said inner surface of said first wiring pattern member and in said connection hole such that said conductive bump extends from said inner surface of said first wiring pattern member to a level short of said second surface of said insulative board so as to not occupy a portion of said connection hole adjacent to said second surface of said insulative board;

filling conductive paste into said portion of said connection hole not occupied by said conductive bump so that the conductive paste fills said portion of said connection hole not occupied by said conductive bump and projects above said second surface of said insulative board to form a fusible contact point portion;

providing a second wiring pattern member having a second adhesive layer attached to a surface thereof; and applying said second adhesive layer of said second wiring pattern member to said second surface of said insulative board, and applying heat so as to melt the fusible contact point portion of said conductive paste to pass through said second adhesive layer and thereby fuse said second wiring pattern member to said conductive paste;

wherein said conductive paste is filled into said connection hole and said heat is applied in such a manner that, when melted, the fusible contact point portion pushes into said second adhesive layer and forms an enlarged press-attachment portion of said conductive paste.

* * * * *